(12) United States Patent
Choi et al.

(10) Patent No.: US 7,910,414 B2
(45) Date of Patent: Mar. 22, 2011

(54) METHOD OF FABRICATING ARRAY SUBSTRATE

(75) Inventors: Hee-Dong Choi, Gumi-si (KR); Sang-Gul Lee, Seoul (KR); Seong-Moh Seo, Suwon-si (KR); Jun-Min Lee, Daegu (KR); Byung-Chul Ahn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/591,501

(22) Filed: Nov. 20, 2009

(65) Prior Publication Data

US 2010/0291741 A1 Nov. 18, 2010

(30) Foreign Application Priority Data

May 15, 2009 (KR) .................. 10-2009-0042494

(51) Int. Cl.
*H01L 21/00* (2006.01)
*H01L 21/84* (2006.01)
(52) U.S. Cl. ............... 438/158; 438/166; 257/E21.414
(58) Field of Classification Search .......... 438/158, 438/166, 30, 197, 149, 150, 34, 29; 257/E21.414, 257/E21.412, E21.347, E33.003, E33.053, 257/59, 72
See application file for complete search history.

(56) References Cited

U.S. PATENT DOCUMENTS

| | | | | |
|---|---|---|---|---|
| 7,833,846 | B1 * | 11/2010 | Choi et al. | 438/149 |
| 2004/0149990 | A1 * | 8/2004 | Oh et al. | 257/59 |
| 2004/0266082 | A1 * | 12/2004 | You | 438/197 |
| 2009/0108260 | A1 * | 4/2009 | Lin et al. | 257/59 |
| 2009/0269872 | A1 * | 10/2009 | Lee et al. | 438/30 |
| 2010/0051954 | A1 * | 3/2010 | Lin et al. | 257/59 |
| 2010/0059754 | A1 * | 3/2010 | Lee et al. | 257/59 |
| 2010/0117090 | A1 * | 5/2010 | Roh et al. | 257/72 |
| 2010/0123138 | A1 * | 5/2010 | Choi et al. | 257/72 |
| 2010/0291741 | A1 * | 11/2010 | Choi et al. | 438/158 |

* cited by examiner

*Primary Examiner* — Walter L Lindsay, Jr.
(74) *Attorney, Agent, or Firm* — McKenna Long & Aldridge LLP

(57) ABSTRACT

A method of fabricating an array substrate includes sequentially forming a first metal layer, a first inorganic insulating layer and an intrinsic amorphous silicon layer on a substrate, the first metal layer including a first metallic material layer and a second metallic material layer; crystallizing the intrinsic amorphous silicon; forming a gate electrode, a gate line, a gate insulating layer and an active layer; forming an interlayer insulating layer including first and second contact holes respectively exposing both sides of the active layer; forming first and second ohmic contact patterns respectively contacting the both sides of the active layers, a source electrode, a drain electrode, and a data line connecting the source electrode; forming a passivation layer on the source electrode, the drain electrode; and forming a pixel electrode on the passivation layer and contacting the drain electrode.

12 Claims, 7 Drawing Sheets

SPC process

METHOD OF FABRICATING ARRAY SUBSTRATE

The present application claims the benefit of Korean Patent Application No. 10-2009-0042494 filed in Korea on May 15, 2009, which is hereby incorporated by reference.

BACKGROUND OF THE INVENTION

1. Field of the Invention

The present invention relates to an array substrate and more particularly to an array substrate being capable of preventing damages on an active layer and having an excellent property.

2. Discussion of the Related Art

As the society has entered in earnest upon an information age, flat panel display devices, which have excellent capabilities of a thin profile, light weight and low power consumption, and so on, are introduced.

Among these devices, an active matrix type liquid crystal display (LCD) device is widely used for notebook computers, monitors, TV, and so on instead of a cathode ray tube (CRT), because of their high contrast ratio and characteristics adequate to display moving images.

On the other hand, an organic electroluminescent display (OELD) device is also widely used because their high brightness and low driving voltage. In addition, since the OELD device is a self-emission type, the OELD device produces high contrast ratio, a thin profile and a fast response time.

Both the LCD device and the OELD device require an array substrate where a thin film transistor (TFT) as a switching element in each pixel for controlling the pixel to be turned on and off.

FIG. 1 is a cross-sectional view showing one pixel region of the related art array substrate. In FIG. 1, a gate electrode 15 is formed on a substrate 11 and in a switching region TrA where a TFT Tr will be formed. A gate line (not shown) connected to the gate electrode 15 is formed along a first direction. A gate insulating layer 18 is formed on the gate electrode 15 and the gate line. A semiconductor layer 28 including an active layer 22 of intrinsic amorphous silicon and an ohmic contact layer 26 of impurity-doped amorphous silicon is formed on the gate insulating layer 18 and in the switching region TrA. A source electrode 36 and a drain electrode 38 are formed on the semiconductor layer 28 and in the switching region TrA. The source electrode 36 is spaced apart from the drain electrode 38. A data line 33 connected to the source electrode 36 is formed along a second direction. The data line 33 crosses the gate line to define a pixel region P. The gate electrode 15, the gate insulating layer 18, the semiconductor layer 28, the source electrode 36 and the drain electrode 38 constitute the TFT Tr.

A passivation layer 42 including a drain contact hole 45 is formed to cover the TFT Tr. On the passivation layer 42, a pixel electrode 50 connected to the drain electrode 38 through the drain contact hole 45 is formed. In FIG. 1, first and second patterns 27 and 23, which are respectively formed of the same material as the ohmic contact layer 26 and the active layer 22, are formed under the data line 33.

In the semiconductor layer 28 of the TFT Tr, the active layer 22 of intrinsic amorphous silicon has a variable thickness. Namely, the active layer 22 has a first thickness t1 at a central portion and a second thickness t2 at side portions. The first thickness t1 is different from the second thickness t2. Properties of the TFT Tr are degraded by the thickness difference in the active layer 22. The thickness difference in the active layer 22 results from a fabricating process explained with reference to FIGS. 2A to 2E.

FIGS. 2A to 2E are cross-sectional views illustrating a fabricating process of the related art array substrate. For convenience of explanation, the gate electrode and the gate insulating layer under the active layer is not shown.

In FIG. 2A, an intrinsic amorphous silicon layer 20, an impurity-doped amorphous silicon layer 24 and a metal layer 30 are sequentially formed on the substrate 11. Then, a photoresist (PR) layer (not shown) is formed on the metal layer 30 by coating a PR material. The PR layer is exposed using an exposing mask and developed to form a first PR pattern 91 having a third thickness and a second PR pattern 92 having a fourth thickness smaller than the third thickness. The first PR pattern 91 covers a portion of the metal layer 30 where the source and drain electrodes are formed, and the second PR pattern 92 covers a space between the source and drain electrodes. The first PR pattern 91 is positioned at both sides of the second PR pattern 92. Other portions of the metal layer 30 are exposed.

In FIG. 2B, the exposed metal layer 30 and the impurity-doped amorphous silicon layer 24 (of FIG. 2A) and the intrinsic amorphous silicon layer 20 (of FIG. 2A) under the exposed metal layer 30 are etched using the first and second PR patterns 91 and 92 as an etching mask. As a result, the active layer 22, an impurity-doped amorphous silicon pattern 25 and a source-drain pattern 31 are formed on the substrate 11.

In FIG. 2C, an ashing process is performed on the first and second PR patterns 91 and 92 (of FIG. 2B) such that the second PR pattern 92 having the fourth thickness is removed. The first PR pattern 91 is partially removed such that a third PR pattern 93, which has a smaller thickness than the first PR pattern 91, is formed on the source-drain pattern 31. A central portion of the source-drain pattern 31 is exposed by removing the second PR pattern 92.

In FIG. 2D, the exposed central portion of the source-drain pattern 31 (of FIG. 2C) is etched to form the source and drain electrodes 36 and 38 spaced apart from each other. As a result, a central portion of the impurity-doped amorphous silicon pattern 25 is exposed through the source and drain electrodes 36 and 38.

In FIG. 2E, a dry-etching process is performed onto the impurity-doped amorphous silicon pattern 25 (of FIG. 2D) to removed the impurity-doped amorphous silicon pattern 25. As a result, the ohmic contact layer 26 is formed under the source and drain electrodes 36 and 38.

In this case, the dry-etching process is performed for a relative long time to completely remove the under the impurity-doped amorphous silicon pattern 25 exposed through a space between the source and drain electrodes 36 and 38. As a result, a central portion of the active layer 22 under the removed impurity-doped amorphous silicon pattern 25 is partially removed by the dry-etching process such that the active layer 22 has a difference in a thickness. (t1≠t2) If the dry-etching process is not performed for a long enough time, the impurity-doped amorphous silicon pattern 25 partially remains on the active layer 22 such that properties of the TFT Tr (of FIG. 1) are seriously degraded. The thickness difference in the active layer 22 is an inevitable result of the above fabricating process for the array substrate.

In addition, since the active layer 22 is partially removed during the dry-etching process, the intrinsic amorphous silicon layer 20 for the active layer 22 should be formed to have an enough thickness above 1000 angstroms such that there are disadvantages in production costs and a fabricating time.

The TFT Tr is very important element for the array substrate. The TFT Tr is positioned in each pixel region and connected to the gate and data line such that a signal is selectively provided the pixel electrode in each pixel region through the TFT Tr. Unfortunately, since the active layer of the TFT Tr is formed of intrinsic amorphous silicon, there are some problems. For example, when light is irradiated onto the active layer or an electric field is applied to the active layer, the active layer is changed to be a metastable state such that there is a problem of a security of the TFT Tr. In addition, since mobility of carriers in a channel of the active layer is relatively low, the TFT Tr including the active layer of intrinsic amorphous silicon is not adequate to a driving element for the OELD device.

To resolve these problems, the TFT including an active layer of polycrystalline silicon, which is crystallized from intrinsic amorphous silicon by a crystallization process using a laser beam, is introduced. However, referring to FIG. 3, which is a cross-sectional view showing a TFT Tr including a semiconductor layer 55 of polycrystalline silicon for the related art array substrate, the semiconductor layer 55 includes a first region 55a and a second region 55b at both sides of the first region 55a. High concentration impurities should be doped into the second region 55b of the semiconductor layer 55. Accordingly, a doping process for the second region 55b and an implant apparatus for the doping process are required such that production costs are seriously increased. In addition, new process line is required.

SUMMARY OF THE INVENTION

Accordingly, the present invention is directed to fabricating an array substrate that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a method of fabricating an array substrate includes sequentially forming a first metal layer, a first inorganic insulating layer and an intrinsic amorphous silicon layer on a substrate where a pixel region and a switching region in the pixel region are defined, the first metal layer including a first metallic material layer and a second metallic material layer covering an upper surface of the first metallic material layer, wherein the first metallic material layer has a resistance and a melting point smaller than the second metallic material layer; crystallizing the intrinsic amorphous silicon into an intrinsic polycrystalline silicon layer; forming a gate electrode, a gate line connected to the gate electrode, a gate insulating layer and an active layer by patterning the intrinsic polycrystalline silicon layer, the first inorganic insulating layer and the first metal layer, the gate electrode, the gate insulating layer and the active layer positioned in the switching region; forming an interlayer insulating layer on the active layer and including first and second contact holes, the first and second contact holes respectively exposing both sides of the active layer; forming first and second ohmic contact patterns respectively contacting both sides of the active layers through the first and second contact holes, a source electrode on the first ohmic contact pattern, a drain electrode on the second ohmic contact pattern, and a data line connecting the source electrode, the data line crossing the gate line to define the pixel region; forming a passivation layer on the source electrode, the drain electrode and the data line and including a drain contact hole exposing the drain electrode; and forming a pixel electrode on the passivation layer and contacting the drain electrode through the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

FIGS. 4A to 4K are cross-sectional views showing a fabricating process of an array substrate according to an exemplary embodiment of the present invention. A switching region, where a TFT will be formed, is defined in a pixel region.

Figure 1:
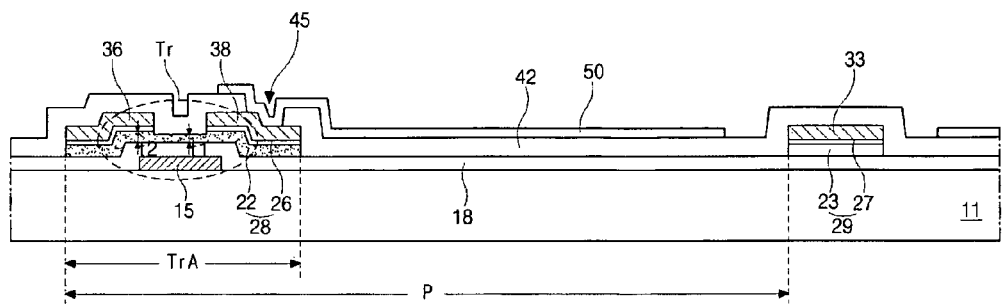
FIG. 1 is a cross-sectional view showing one pixel region of the related art array substrate.
Figure 2A:
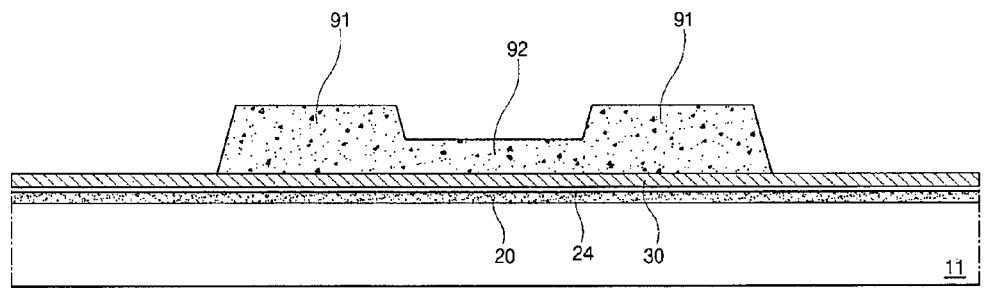
FIGS. 2A to 2E are cross-sectional views illustrating a fabricating process of the related art array substrate.
Figure 2B:
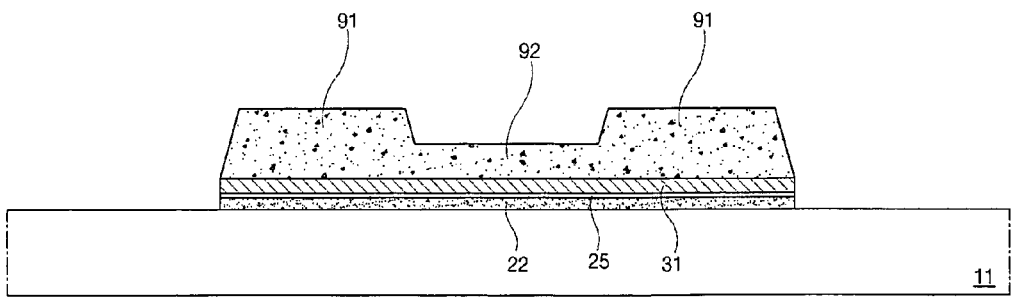
Figure 2C:
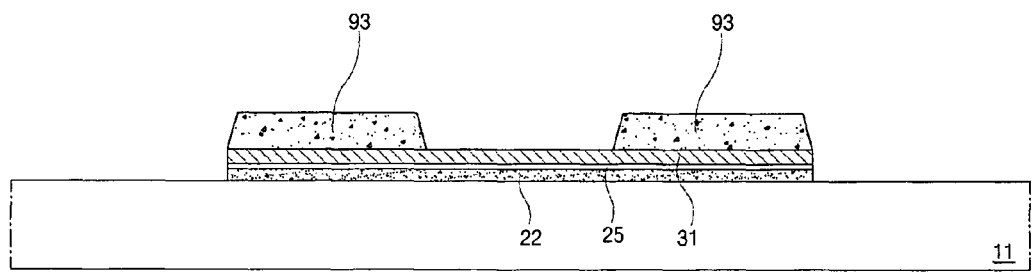
Figure 2D:
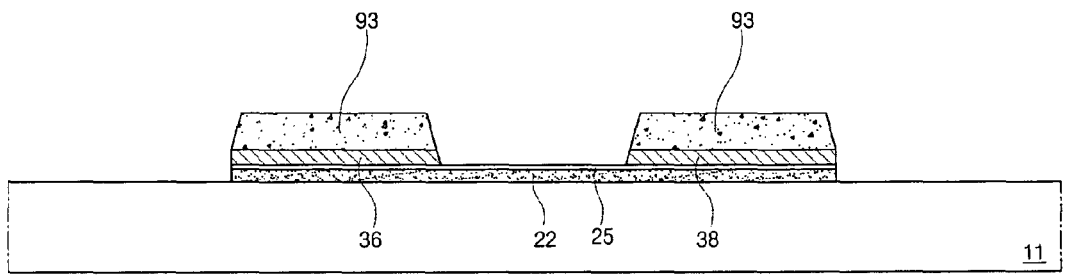
Figure 2E:
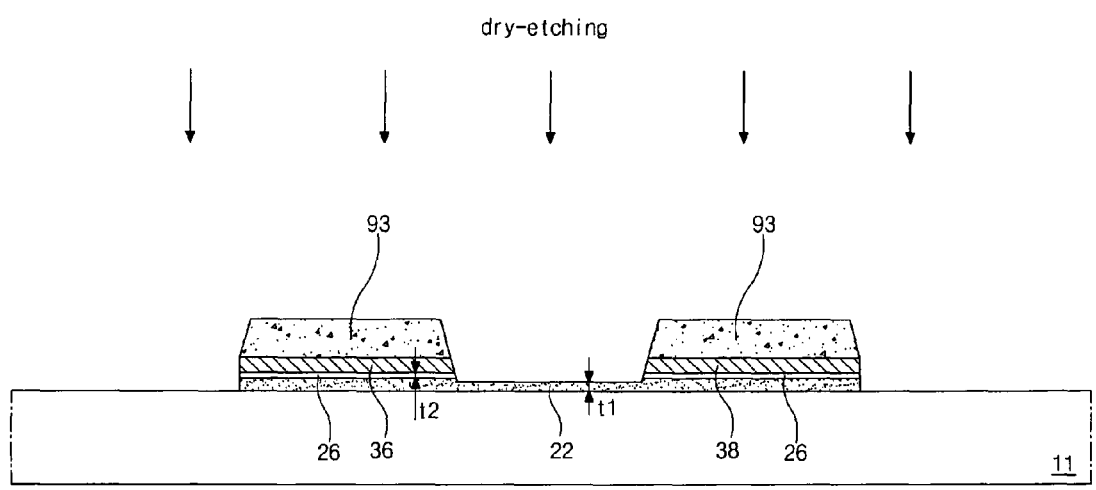
Figure 3:
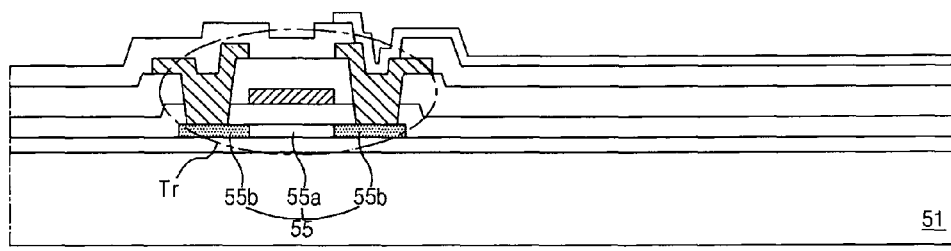
FIG. 3, which is a cross-sectional view showing a TFT including a semiconductor layer of polycrystalline silicon for the related art array substrate.
Figure 4A:
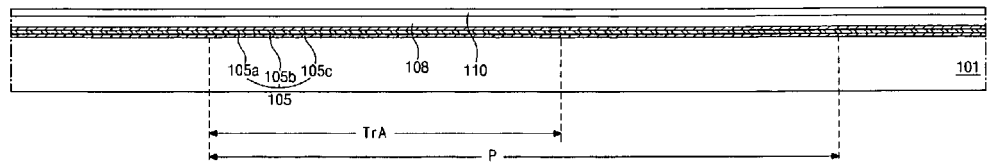
FIGS. 4A to 4K are cross-sectional views showing a fabricating process of an array substrate according to an exemplary embodiment of the present invention.

First, as shown in FIG. 4A, a first metal layer 105 including first to third sub-layers 105a, 105b and 105c is formed on a substrate 101 by depositing three material selected from a first metallic material group including aluminum (Al), Al alloy, copper (Cu), Cu alloy, titanium (Ti), molybdenum (Mo) and titanium-molybdenum alloy (MoTi). The first metal layer 105 has a thickness of about 1000 to 5000 angstroms. For example, the first to third sub-layers 105a to 105c may be one of Mo/Al(or Al alloy)/Mo, Ti/Cu(or Cu alloy)/Ti, MoTi/Cu (or Cu alloy)/MoTi and Mo/Cu(or Cu alloy)/Mo. Alternatively, the first metal layer 105 may have a double-layered structure. In this case, the double layers of the first metal layer 105 may be Al alloy/Mo.

Since the first metal layer 105 has a double-layered structure or a triple-layered structure, a thermal deformation of the first metal layer 105 during a solid phase crystallization (SPC) process, which will be performed to crystallize intrinsic amorphous silicon, can be minimized. In addition, since the first metal layer 105 includes one of Al, Al alloy, Cu and Cu alloy, each of which have a low resistance property, a resistance of a gate line can be minimized.

A first inorganic insulating layer 108 is formed on the first metal layer 105 by depositing an inorganic insulating material, for example, silicon oxide or silicon nitride. The first inorganic insulating layer 108 has a single-layered structure or a double-layered structure. The single layer of the first inorganic insulating layer 108 is formed of silicon oxide. The double layers of the first inorganic insulating layer 108 include a lower layer of silicon nitride and an upper layer of silicon oxide. Namely, an upper surface of the first inorganic insulating layer 108 is a silicon oxide film to improve a contact property with an intrinsic amorphous silicon layer which will be formed later. Since a contact property of the silicon oxide layer to the intrinsic amorphous silicon layer is better than that of the silicon nitride layer to the intrinsic amorphous silicon layer, the upper layer of the first inorganic insulating layer 108 includes the silicon oxide layer. In addition, since a process time for the silicon nitride layer is shorter than that for the silicon oxide, the lower layer of first inorganic insulating layer 108 includes the silicon nitride layer. The first inorganic insulating layer 108 has a thickness of about 500 to 4000 angstroms.

An intrinsic amorphous silicon layer 110 is formed on the first inorganic insulating layer 108 by depositing intrinsic amorphous silicon. Both of the first inorganic insulating layer 108 and the intrinsic amorphous silicon layer 110 are sequentially formed using a chemical vapor deposition (CVD) apparatus by changing a reaction gas.

The intrinsic amorphous silicon layer 110 has a thickness of about 400 to 600 angstroms. In the related art array substrate, the active layer of intrinsic amorphous silicon should have a thickness above 1000 angstroms because the active layer is partially removed by the dry-etching process for the ohmic contact layer. However, since the intrinsic amorphous silicon layer 110 is not exposed to a dry-etching process, the intrinsic amorphous silicon layer 110 has a thickness being capable of serving as an active layer. Namely, the intrinsic amorphous silicon layer 110 has a relatively low thickness of about 400 to 600 angstroms such that production costs and a fabricating time are reduced.

Figure 4B:
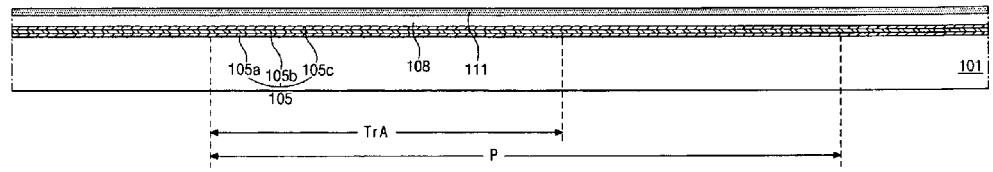

Next, as shown in FIG. 4B, to improve a mobility property of the intrinsic amorphous silicon layer 110 (of FIG. 4A), the SPC process is performed. The intrinsic amorphous silicon layer 110 is crystallized by the SPC process to form an intrinsic polycrystalline silicon layer 111. For example, the SPC process is a thermal crystallization process or an alternating magnetic field crystallization process. In the thermal crystallization process, the intrinsic amorphous silicon layer 111 is heated under a temperature of about 600 to 700°. In the alternating magnetic field crystallization process, the intrinsic amorphous silicon layer 110 is crystallized using alternating magnetic field crystallization apparatus under a temperature of about 600 to 700°.

In the present invention, since the SPC process is performed before the first metal layer 105 is patterned, the first metal layer 105 covers an entire surface of the substrate 101 during the SPC process. Accordingly, a thermal deformation of the first metal layer 105 by the SPC process is further minimized.

Generally, a crystallizing process is performed after the metal layer is patterned to form a gate line and a gate electrode. In this case, a side surface of the metal layer is exposed to the SPC process, a thermal deformation is generated. Even if the metal layer has a double-layered structure or a triple-layered structure, a low resistance metal layer is exposed to the SPC process such that a thermal deformation is generated. Accordingly, a desired gate line or gate electrode cannot be obtained. Consequently, a positional relation between the gate electrode and each of an active layer of polycrystalline silicon, a source electrode and a drain electrode is changed such that properties of the TFT are degraded.

However, in the present invention, the SPC process is performed before the first metal layer 105 is patterned, the first metal layer 105 covers an entire surface of the substrate 101 during the SPC process such that a low resistance material layer, which is a middle layer, i.e., the second sub-layer 105b, in the triple-layered structure or a bottom layer in the double-layered structure, is not exposed to the SPC process. As a result, a thermal deformation of the first metal layer 105 is minimized. In the first metal layer 105 having the triple-layered structure, the first sub-layer 105a at a bottom position and the third sub-layer 105c at a top position have a relatively high melting point such that there is no damage. Accordingly, by patterning the first metal layer 105, a desired gate line and gate electrode can be obtained, and a degradation of the TFT's properties can be prevented. The second sub-layer 105b as a middle layer has a resistance and a melting point smaller than the first and third sub-layers 105a and 105c.

Figure 4C:
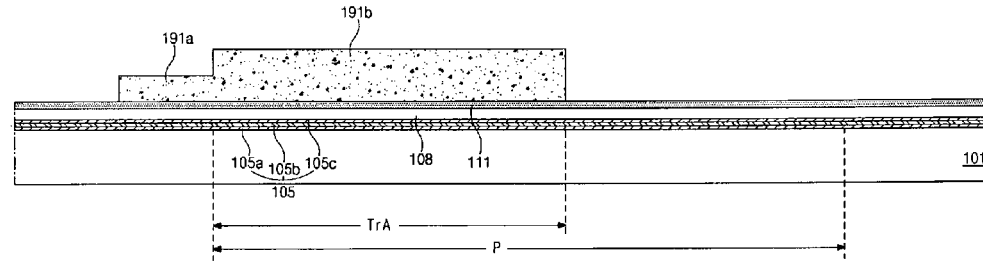

Next, as shown in FIG. 4C, a photoresist (PR) layer (not shown) is formed on the intrinsic polycrystalline silicon layer 111 by coating a PR material. An exposing mask (not shown) including a tranmissive portion, a blocking portion and a half-transmissive portion is disposed over the PR layer. The half-transmissive portion has light transmittance smaller than the transmissive portion and larger than the blocking portion. The half-transmissive portion is formed of a slit or multiple coating layers. The exposing mask may be referred to as a half-tone mask. The PR layer is exposed through the exposing mask and developed to form a first PR pattern 191a having a first thickness and a second PR pattern 191b having a second thickness larger than the first thickness. The first PR pattern 191a corresponds to a portion where a gate line will be formed, and the second PR pattern 191b corresponds to a portion where a gate electrode will be formed. Namely, the second PR pattern 191b is positioned in the switching region TrA, and the first PR pattern 191a extends from one end of the second PR pattern 191b. If the gate electrode perpendicularly protrudes from the gate line, the first PR pattern 191a extends along a direction to be perpendicular to the second PR pattern 191b in a plane view. Other portions are exposed through the first and second PR patterns 191a and 191b.

Figure 4D:
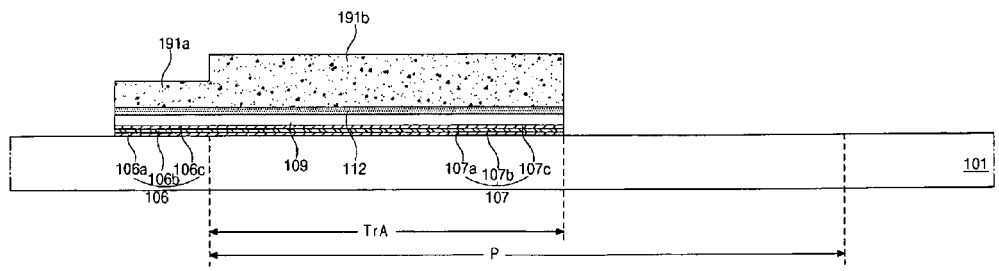

Next, as shown in FIG. 4D, the intrinsic polycrystalline silicon layer 111 (of FIG. 4C) exposed through the first and second PR patterns 191a and 191b and the first inorganic insulating layer 108 (of FIG. 4C) and the first metal layer 105 (of FIG. 4C) under the exposed intrinsic polycrystalline silicon layer 111 are etched to form a gate electrode 107, a gate insulating layer 109 and an intrinsic polycrystalline silicon pattern 112 stacked on the substrate 101. At the same time, a gate line 106 extending from the gate electrode 107 is formed at a boundary of the pixel region P. The gate electrode 107 has a triple-layered structure of a bottom layer 107a, a middle layer 107b and a top layer 107c, and the gate line 106 has a triple-layered structure of a bottom layer 106a, a middle layer 106b and a top layer 106c. Each of the bottom layer 107a and the top layer 107c of the gate electrode 107 is formed of a metallic material having a high melting point, and the middle layer 107b of the gate electrode 107 is formed of a metallic material having a low resistance. Each of the bottom layer 106a and the top layer 106c of the gate line 106 is formed of a metallic material having a high melting point, and the middle layer 106b of the gate line 106 is formed of a metallic material having a low resistance.

Figure 4E:
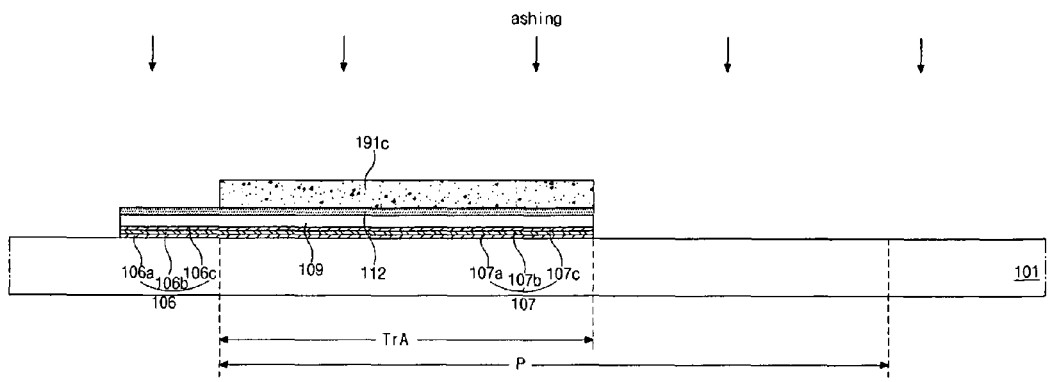

Next, as shown in FIG. 4E, an ashing process is performed on to the first and second PR patterns 191a and 191b (of FIG. 4D) to remove the first PR pattern 191a and form a third PR pattern 191c, which corresponding to the gate electrode 107, from the second PR pattern 191b. As a result, one side of the intrinsic polycrystalline silicon layer 112 is exposed by removing the first PR patterns 191a. Namely, a portion of the intrinsic polycrystalline silicon pattern 112 corresponding to the gate line 106 is exposed. Since a thickness of the second PR pattern 191b is also reduced by the ashing process, the third PR pattern 191c has a thickness smaller than the second PR pattern 191b.

Figure 4F:
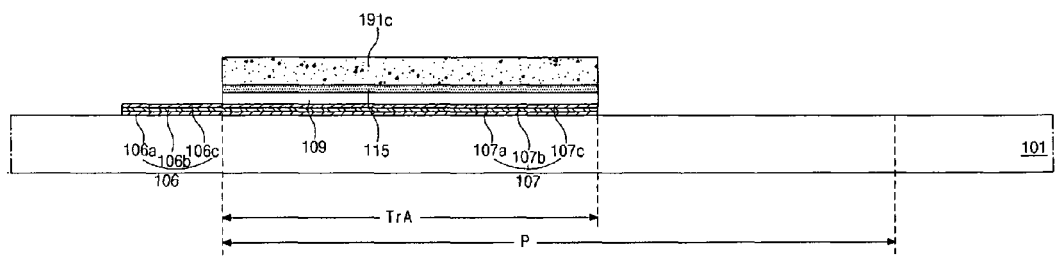
Figure 4G:
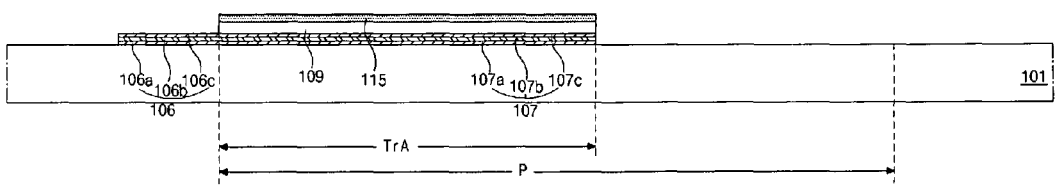

Next, as shown in FIG. 4F, the exposed intrinsic polycrystalline silicon layer 112 (of FIG. 4E) and the gate insulating layer 109 are etched to expose the gate line 106. The remained portion of the intrinsic polycrystalline silicon pattern 112 due to the second and third PR patterns 191b and 191c is defined as an active layer 115. Since the active layer 115 and the gate insulating layer 109 are patterned using the third PR pattern 191c, the active layer 115 and the gate insulating layer 109 have substantially the same shape, size and position as each other to perfectly overlap.

Figure 5:
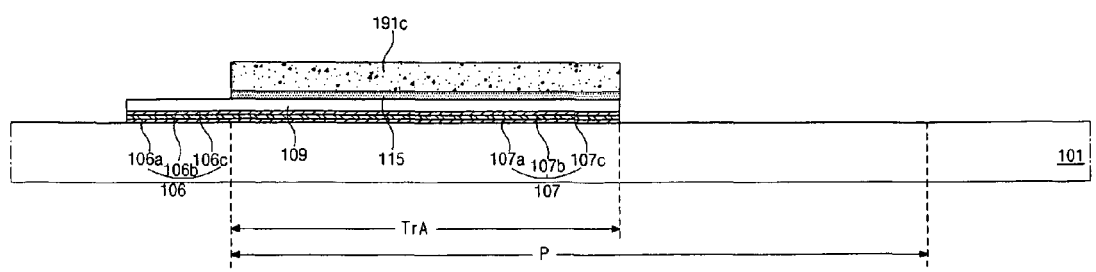
FIG. 5 is a cross-sectional view showing a fabricating process for an active layer of array substrate according to a modified exemplary embodiment of the present invention.

On the other hand, referring to FIG. 5, which is a cross-sectional view showing a fabricating process for an active layer of array substrate according to a modified exemplary embodiment of the present invention, only the exposed intrinsic polycrystalline silicon pattern (not shown) is etched to form an active layer 115. Namely, the gate insulating layer 109 is not etched. Accordingly, the gate insulating layer has the same shape, size and position as a combined element of the gate electrode 107 and the gate line 106.

Referring again to FIGS. 4A to 4K, as shown in FIG. 4G, a stripping process is performed onto the third PR pattern 191c (of FIG. 4F) to remove the third PR pattern 191c and expose the active layer 115.

Figure 4H:
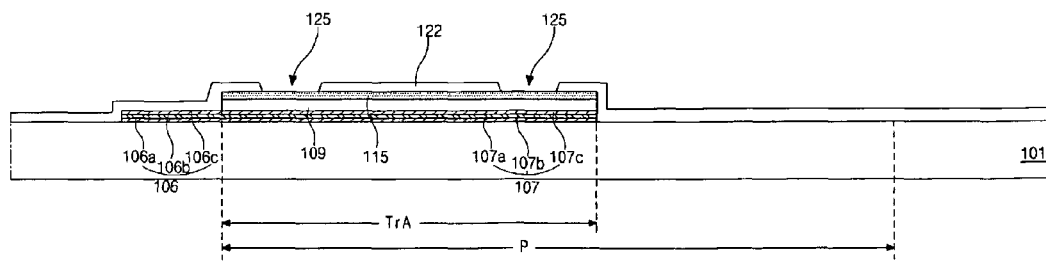

Next, as shown in FIG. 4H, a second inorganic insulating layer (not shown) is formed on the active layer 115 and the gate line 106 by depositing an inorganic insulating material, for example, silicon oxide or silicon nitride.

The second inorganic insulating layer is patterned by a mask process, which includes a step of forming a PR layer, a step of exposing the PR layer using an exposing mask, a step of developing the PR layer to form a PR pattern, a step of etching the second inorganic insulating layer using the PR pattern as an etching mask, and a step of stripping the PR pattern, to form an interlayer insulating layer 122 including two contact holes 125. Both side portions of the active layer 115 are exposed by the contact holes 125. A center portion of the active layer 155 is covered with a portion of the interlayer insulating layer 122 between the contact holes 125. The interlayer insulating layer 122 covering the center portion of the active layer 115 serves as an etch-stopper.

Figure 4I:
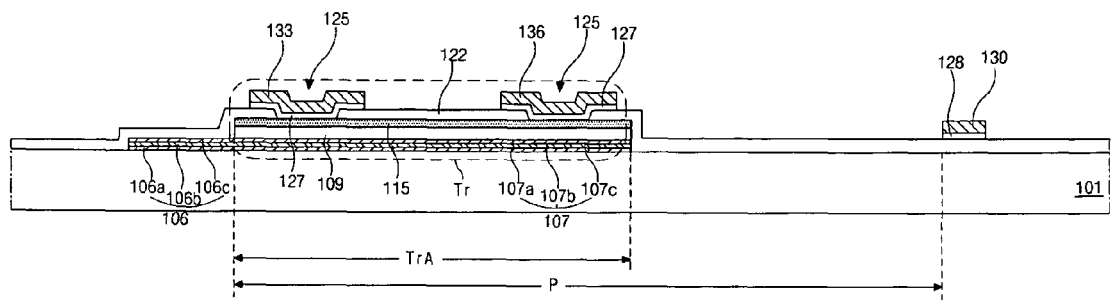

Next, as shown in FIG. 4I, an impurity-doped amorphous silicon layer (not shown) and a second metal layer (not shown) are formed on the interlayer insulating layer 122 including the contact holes 125 by sequentially depositing impurity-doped amorphous silicon and a second metallic material. The impurity-doped amorphous silicon layer has a thickness of about 100 to 300 angstroms. The second metal layer is stacked on the impurity-doped amorphous silicon layer and formed of one of molybdenum (Mo), chromium (Cr) and molybdenum-titanium alloy (MoTi).

Before the impurity-doped amorphous silicon layer is formed, a barrier layer (not shown) having a thickness of about 50 to 100 angstroms may be formed on the interlayer insulating layer 122 by depositing intrinsic amorphous silicon. Contact strength between intrinsic amorphous silicon and intrinsic polycrystalline silicon is larger than that between impurity-doped amorphous silicon and intrinsic polycrystalline silicon. Accordingly, the barrier layer of intrinsic amorphous silicon is positioned between the active layer 115 and the impurity-doped amorphous silicon layer to improve contact strength between the active layer 115 of intrinsic polycrystalline silicon and the impurity-doped amorphous silicon layer. The barrier layer is not essential.

The second metal layer and the impurity-doped amorphous silicon layer are patterned by a mask process to form a data line 130 crossing the gate line 106 to define the pixel region P. At the same time, ohmic contact patterns 127, a source electrode 133 and a drain electrode 136 are formed in the switching region TrA. One of the ohmic contact patterns 127 contacts the exposed active layer 115 through one of the contact hole 125 of the interlayer insulating layer 122, and the source electrode 133 is stacked on the one of the ohmic contact patterns 127. The other one of the ohmic contact patterns 127 contacts the exposed active layer 115 through the other one of the contact holes 125 of the interlayer insulating layer 122, and the drain electrode 136 are stacked on the other one of the ohmic contact patterns 127. Namely, the one of the ohmic contact patterns 127 and the source electrode 133 are spaced apart from the other one of the ohmic contact patterns 127 and the drain electrode 136, respectively. Since the one of the ohmic contact patterns 127 and the source electrode 133 are patterned by a single mask process, they have substantially the same plane area and the same plane shape as each other to perfectly overlap each other. Similarly, the other one of the ohmic contact patterns 127 and the drain electrode 136 have substantially the same plane area and the same plane shape as each other. The source electrode 133 is connected to the data line 130. In addition, a first dummy pattern 128 at the same layer as the ohmic contact layers 127 is between the interlayer insulating layer 122 and the data line 130.

When the barrier layer is formed, barrier patterns (not shown) are disposed under the ohmic contact patterns 127 and contacts the active layer 115 through the contact holes 125 of the interlayer insulating layer 122. In addition, a second dummy pattern 126 at the same layer as the barrier patterns is disposed between the first dummy pattern 128 and the interlayer insulating layer 122.

In the present invention, since a portion of the interlayer insulating layer 122 as the etch-stopper covers the center portion of the active layer 115, there is no damage on the active layer 115 during an dry-etching process for the ohmic contact patterns 127. Namely, since the interlayer insulating layer 122 covers the center portion of the active layer 115 during the dry-etching process for the ohmic contact patterns 127, the interlayer insulating layer 122 protects the active layer 115 such that a thickness of the active layer 115 is not reduced by the dry-etching process. Accordingly, the active layer 115 has an uniform thickness.

After the second metal layer is patterned to form the source and drain electrodes 133 and 136, the dry-etching process is performed to etch the exposed portion of the impurity-doped amorphous silicon layer. In this case, since there is the interlayer insulating layer 122 as an etch-stopper between the source and drain electrodes 133 and 136, there is no damage on the active layer 115. Accordingly, the active layer 115 has an uniform thickness through an entire of the switching region TrA.

The gate electrode, the gate insulating layer 109, the active layer 115 of intrinsic polycrystalline silicon, the interlayer insulating layer 122, the ohmic contact patterns 127 of impurity-doped amorphous silicon and the source and drain electrodes 133 and 136 constitute the TFT Tr.

Although not shown, when the array substrate is used for the OELD device, a power line is formed at the same layer as the data line 130 to be parallel to the data line 130. In addition, a driving TFT having substantially the same structure as the above TFT Tr as a switching TFT and being connected to the above TFT Tr and the power line is further formed.

Figure 4J:
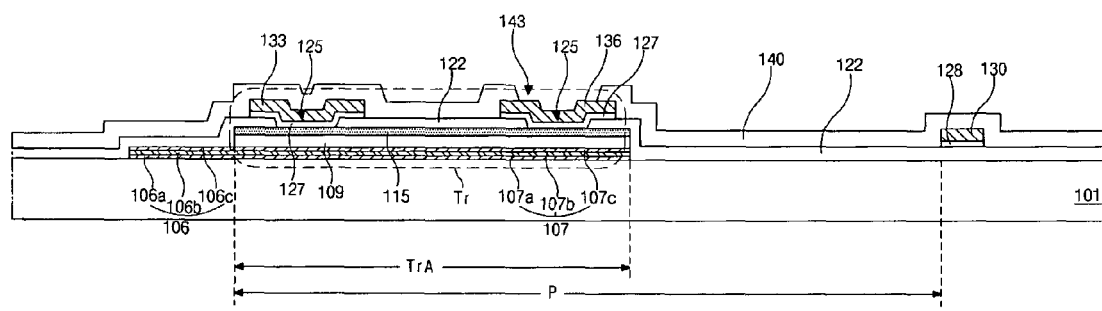

Next, as shown in FIG. 4J, a passivation layer 140 is formed on the data line 130, the source electrode 133 and the drain electrode 136 by depositing an inorganic insulating material, for example, silicon oxide or silicon nitride. The passivation layer 140 is patterned by a mask process to form a drain contact hole 143 exposing the drain electrode 136.

Figure 4K:
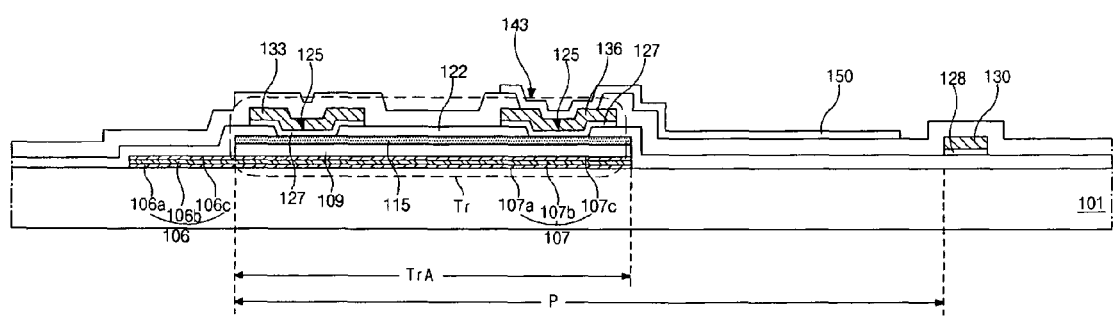

Next, as shown in FIG. 4K, a transparent conductive material layer (not shown) is formed on the passivation layer 140 including the drain contact hole 143 by depositing a transparent conductive material, for example, indium-tin-oxide (ITO) or indium-zinc-oxide (IZO). The transparent conductive material layer is patterned by a mask process to form a pixel electrode 150 contacting the drain electrode 136 through the drain contact hole 143 and positioned in each pixel region P.

On the other hand, when the driving TFT is formed to use the array substrate for the OELD device, the pixel electrode 150 does not contact the drain electrode 136 of the TFT Tr as the switching TFT. The pixel electrode 150 contacts a drain electrode of the driving TFT through a contact hole exposing the drain electrode of the driving TFT, and the passivation layer 140 does not expose the drain electrode 136 of the TFT Tr. The switching TFT and the driving TFT are connected to each other.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an array substrate, comprising:
   sequentially forming a first metal layer, a first inorganic insulating layer and an intrinsic amorphous silicon layer on a substrate where a pixel region and a switching region in the pixel region are defined, the first metal layer including a first metallic material layer and a second metallic material layer covering an upper surface of the first metallic material layer, wherein the first metallic material layer has a resistance and a melting point smaller than the second metallic material layer;
   crystallizing the intrinsic amorphous silicon into an intrinsic polycrystalline silicon layer;
   forming a gate electrode, a gate line connected to the gate electrode, a gate insulating layer and an active layer by patterning the intrinsic polycrystalline silicon layer, the first inorganic insulating layer and the first metal layer, the gate electrode, the gate insulating layer and the active layer positioned in the switching region;
   forming an interlayer insulating layer on the active layer and including first and second contact holes, the first and second contact holes respectively exposing both sides of the active layer;
   forming first and second ohmic contact patterns respectively contacting both sides of the active layers through the first and second contact holes, a source electrode on the first ohmic contact pattern, a drain electrode on the second ohmic contact pattern, and a data line connecting the source electrode, the data line crossing the gate line to define the pixel region;
   forming a passivation layer on the source electrode, the drain electrode and the data line and including a drain contact hole exposing the drain electrode; and
   forming a pixel electrode on the passivation layer and contacting the drain electrode through the drain contact hole.

2. The method according to claim 1, wherein the first metal layer further includes a third metallic material layer under the first metallic material layer, and the first metallic material layer has a resistance and a melting point smaller than the third metallic material layer.

3. The method according to claim 2, wherein the solid phase crystallization process is one of a thermal crystallization process or an alternating magnetic field crystallization process.

4. The method according to claim 2, wherein the active layer has a thickness of about 400 to 600 angstroms.

5. The method according to claim 2, wherein each of the second and third metallic material layers is formed of one of titanium, molybdenum and titanium-molybdenum alloy, and the first metallic material layer is formed of one of aluminum, aluminum alloy, copper and copper alloy.

6. The method according to claim 1, wherein the step of forming the gate electrode, the gate line, the gate insulating layer and the active layer includes:
   forming first and second photoresist (PR) patterns on the intrinsic polycrystalline silicon layer, the first PR pattern has a first thickness and corresponding to the active layer, the second PR pattern has a second thickness smaller than the first thickness and corresponding to the gate line;
   forming the gate electrode, an inorganic insulating pattern and an intrinsic polycrystalline silicon pattern stacked in the switching region, and the gate line by etching the intrinsic polycrystalline silicon layer exposed through the first and second PR patterns and the first inorganic insulating layer and the first metal layer under the exposed intrinsic polycrystalline silicon layer;
   ashing the second PR pattern to expose one side of the intrinsic polycrystalline silicon pattern;
   forming the gate insulating layer on the gate electrode and the active layer on the gate insulating layer by etching the exposed intrinsic polycrystalline silicon pattern and the inorganic insulating pattern under the exposed intrinsic polycrystalline silicon pattern; and
   removing the first PR pattern.

7. The method according to claim 1, wherein the step of forming the gate electrode, the gate line, the gate insulating layer and the active layer includes:
   forming first and second photoresist (PR) patterns on the intrinsic polycrystalline silicon layer, the first PR pattern has a first thickness and corresponding to the active layer, the second PR pattern has a second thickness smaller than the first thickness and corresponding to the gate line;
   forming the gate electrode, the gate insulating layer and an intrinsic polycrystalline silicon pattern stacked in the switching region, and the gate line by etching the intrinsic polycrystalline silicon layer exposed through the first and second PR patterns and the first inorganic insulating layer and the first metal layer under the exposed intrinsic polycrystalline silicon layer;
   ashing the second PR pattern to expose one side of the intrinsic polycrystalline silicon pattern;
   forming the gate insulating layer on the gate electrode and the active layer on the gate insulating layer by etching the exposed intrinsic polycrystalline silicon pattern such that the gate insulating layer covering the gate line; and
   removing the first PR pattern.

8. The method according to claim 1, wherein the solid phase crystallization process is one of a thermal crystallization process or an alternating magnetic field crystallization process.

9. The method according to claim 1, wherein the step of forming the first and second ohmic contact patterns, the source and drain electrodes and the data line includes:
- sequentially forming an impurity-doped amorphous silicon layer and a second metal layer on the interlayer insulating layer; and
- sequentially patterning the impurity-doped amorphous silicon layer and the second metal layer to form the first and second ohmic contact patterns, the source and drain electrodes and the data line.

10. The method according to claim 9, wherein the first and second ohmic contact patterns has substantially the same plane area and shape as the source and drain electrodes, respectively.

11. The method according to claim 1, wherein the active layer has a thickness of about 400 to 600 angstroms.

12. The method according to claim 1, wherein each of the second and third metallic material layers is formed of one of titanium, molybdenum and titanium-molybdenum alloy, and the first metallic material layer is formed of one of aluminum, aluminum alloy, copper and copper alloy.

* * * * *